United States Patent [19]

Kikumoto

[11] Patent Number: 5,074,184

[45] Date of Patent: Dec. 24, 1991

[54] CONTROLLABLE ELECTRONIC MUSICAL INSTRUMENT

[75] Inventor: Tadao Kikumoto, Shizuoka, Japan

[73] Assignee: Roland Corporation, Osaka, Japan

[21] Appl. No.: 448,907

[22] Filed: Dec. 12, 1989

[30] Foreign Application Priority Data

Dec. 20, 1988 [JP] Japan ............................ 63-320916

[51] Int. Cl.[5] ..................... G10H 7/00; G10H 1/02; G10H 1/46; H03G 3/00

[52] U.S. Cl. ..................................... 84/626; 84/629; 84/633

[58] Field of Search ................ 84/626, 627, 629, 633, 84/658, 659, 662, 663, 665

[56] References Cited

U.S. PATENT DOCUMENTS

| | | | |
|---|---|---|---|
| 4,018,125 | 4/1977 | Nishimoto | 84/658 |
| 4,448,104 | 5/1984 | Hoshii | 84/627 X |
| 4,528,885 | 6/1985 | Chihana | 84/658 X |
| 4,539,884 | 9/1985 | Aoki | 84/633 X |
| 4,552,051 | 11/1985 | Takeuchi | 84/626 |
| 4,674,382 | 6/1987 | Yorihisa | 84/626 |
| 4,875,400 | 10/1989 | Okuda et al. | 84/626 |
| 4,957,032 | 9/1990 | Hirano et al. | 84/622 |
| 4,961,363 | 10/1990 | Mizuno et al. | 84/615 |
| 4,961,364 | 10/1990 | Tsutsumi et al. | 84/627 |
| 4,972,753 | 11/1990 | Adachi et al. | 84/626 |

FOREIGN PATENT DOCUMENTS

| | | |
|---|---|---|
| 0192984 | 9/1986 | European Pat. Off. . |
| 2090693 | 7/1982 | United Kingdom . |

*Primary Examiner*—William M. Shoop, Jr.
*Assistant Examiner*—Jeffrey W. Donels
*Attorney, Agent, or Firm*—Beveridge, DeGrandi & Weilacher

[57] ABSTRACT

A controllable electronic musical instrument is disclosed as including tone pitch-assigning devices for assigning pitches to musical tones to be generated, manually operable members for producing detectable signals indicative of a touching of such members for operation thereof, a control message-producing device which is responsive to symbols from the manually operable members for producing musical tone-controlling messages that have magnitudes which automatically change in time, and a musical tone-generating device for generating musical tones based on musical tone-controlling messages produced by the control message-producing device, and based on a pitch assigned by the tone pitch-assigning devices. The tone pitch-assigning devices and the manually operable members may be provided as keys on a keyboard. The control message-producing device could include a microcomputer adapted to process data received from the assigning device and from the manually operable members to cause the tone generating device, which includes a speaker, to generate controlled musical tones.

13 Claims, 7 Drawing Sheets

FIG. 1
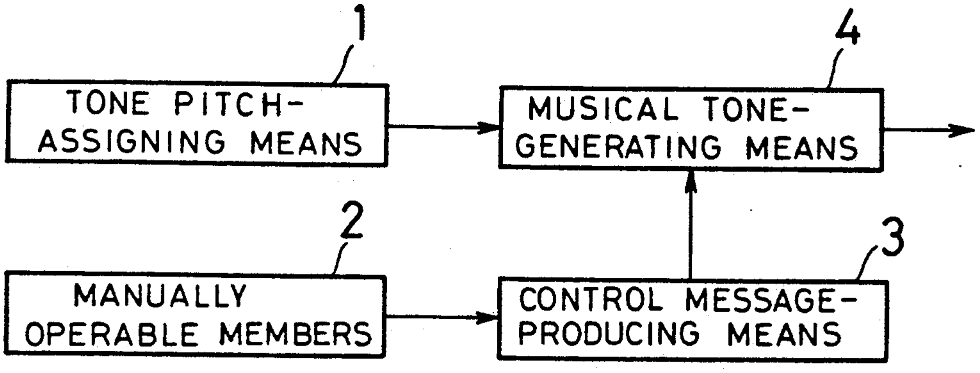
FIG. 3
| |
|---|
| Key Nos. |
| Velocity |
| BP |
| K |
| Current |
| BP1 (table) |
| BP2 (table) |
| KON (table) |
| KOFF (table) |
FIG. 4(a)
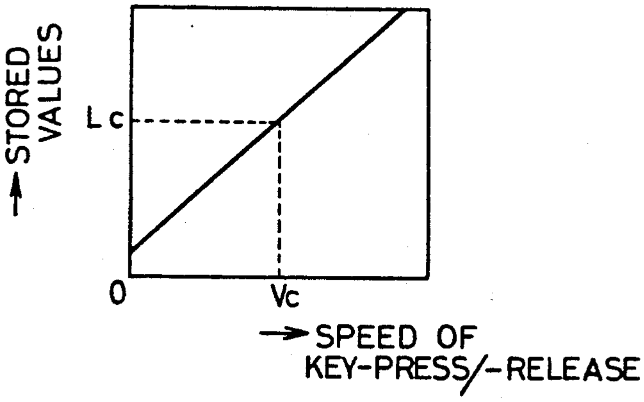
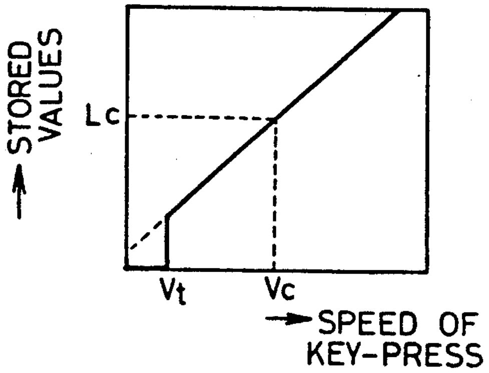
FIG. 4(b)

| | SETTING MEMBER 26C | SETTING MEMBER 26H |
|---|---|---|
| b | ON | ON |
| c | ON | ON |
| d | ON | ON |
| e | OFF | ON |
| f | ON | OFF |
| g | OFF | OFF |

CONTROLLABLE ELECTRONIC MUSICAL INSTRUMENT

BACKGROUND OF THE INVENTION

1. Field of the Invention

The invention relates to a controllable electronic musical instrument in which musical tones of assigned pitches are generated in a manner such that the musical tones are controlled according to detectable touches of musical tone-controlling means such as manually operable members.

2. Description of Related Art

There are known some electronic musical instruments comprising on/off-switches which are provided as musical tone-controlling means and are utilized to conduct simple on/off-control for producing vibrato effects or other musical effects. There are also known electronic musical instruments in which nature, degree or manner of the vibrato effects is controlled in response to pressures detectably imparted to a manually operable member.

SUMMARY OF THE INVENTION

The simple on/off-control of the vibrato effects by means of said known on/off-switches however cannot produce delicate shades or variations in musical tones, in particular, such tone changes as found in the course of time.

In the known method of vibrato control relying upon the detectable pressures imparted to the manually operable member, said pressures per se are made use of as direct messages or signals for control of musical tones. This system causes an operator or player to change the pressures in the course of time whenever he desires to change musical tones relative to time lapse. Therefore, higher grade of playing technique will be required in such a case.

The present invention was made to resolve those problems, and an object of the invention is to provide a controllable electronic musical instrument which can be used without necessitating high grade playing technique even when some musical tones are changed delicately or variably in the course of time.

According to the invention which accomplishes the above mentioned object, a controllable electronic musical instrument comprises the following structural features as shown in FIG. 1, namely;

(a) tone pitch-assigning means (1) assigning pitches to musical tones which are to be generated,
(b) manually operable members (2) producing detectable operation touches,
(c) control message-producing means (3) automatically producing musical tone-controlling messages each having a magnitude which changes in the course of time and in accordance with the corresponding operation touch produced by the manually operable members (2), and
(d) musical tone-generating mean (4) automatically generating musical tones each controlled based on the musical tone-controlling messages produced in the control message-producing means (3) and each having a pitch assigned by the tone pitch-assigning means (1).

Thus, the respective musical tone-controlling messages automatically produced in the producing means (3) are of respective magnitudes or intensities which change in the course of time corresponding to such detectable operation touches that are produced by operation of the manually operable members (2). Said musical tone-controlling messages are utilized by the musical tone-generating means (4) when it controls and generates musical tones each having a pitch assigned by the assigning means (1).

Therefore, pressures manually imparted to the operable members need not be changed in the course of time, but the said touches per se of operable members in the invention are effective to automatically produce the musical tone-controlling messages changing in the course of time. Highly skilled technique is not necessary any more for players to generate musical tones which respectively change in a delicate manner or in varied manners relative to time lapse.

The present invention may also be embodied in a way such that it comprises:

(a) tone pitch-assigning means assigning pitches to musical tones which are to be generated,
(b) manually operable members adapted to be operated from their OFF-states into ON-states at first speeds and/or from their ON-states into OFF-states at second speeds, the first and second speeds being detectable, the manually operable members comprising an operable member and a further operable member respectively causing musical tone-controlling messages for the musical tones which are to be generated to be of actual magnitudes higher than a standard magnitude and lower than the standard magnitude,
(c) control message-producing means automatically producing musical tone-controlling messages having magnitudes which change in the course of time up to such values and with such sharpness of change that correspond to the first speeds when the manually operable members are operated into their ON-states, the control message-producing means further automatically producing the musical tone-controlling messages having magnitudes which decrease also in the course of time down to such values and with such sharpness of change that correspond to the second speeds when the manually operable members are operated into their OFF-states, and
(d) musical tone-generating means generating musical tones each controlled based on the musical tone-controlling messages produced in the control message-producing means and each having a pitch assigned by the tone pitch-assigning means.

Alternatively, the present invention may be embodied in another way such that it comprises (a) tone pitch-assigning means assigning pitches to musical tones which are to be generated,
(b) manually operable members adapted to be operated from their OFF-states into ON-states and vice versa wherein detectable are at least such speeds at which said members are operated from OFF-states into ON-states, the manually operable members comprising an operable member and a further operable member respectively causing musical tone-controlling messages for the musical tones which are to be generated to be of actual magnitudes higher than a standard magnitude and lower than the standard magnitude,
(c) control message-producing means automatically producing when the manually operable members are operated into their ON-states or into their OFF-states the musical tone-controlling messages having magnitudes which change in the course of time towards such values and with such sharpness of change that correspond to the speeds at which said operable members are operated, and (d) musical tone-generating means generating musical tones each controlled based on the musical tone-controlling messages produced in the control message-producing means and each having a pitch assigned by the tone pitch-assigning means.

BRIEF DESCRIPTION OF THE DRAWINGS

The present invention will become more apparent from the detailed description and the accompanying drawings, wherein:

FIG. 1 is a block diagram showing the invention as defined in the claims;

FIGS. 2 to 11 illustrate a controllable electronic musical instrument in an embodiment of the invention; in FIG. 2 shows in outline the musical instrument, FIG. 3 illustrates memory areas in a RAM, FIGS. 4(*a*) and 4(*b*) show data stored in tables, FIGS. 5 to 7 are flowcharts respectively showing a key-on-event processing, a key-off-event processing and a timer-interrupt processing which are executed in a microcomputer, FIG. 8 is a graph illustrating the timer-interrupt processing, FIG. 9 are time charts showing relationships between control signals and key-depression/release of keys included in a second part of a keyboard, FIG. 10 illustrates various exemplified modes in which the controllable electronic musical instrument may be used, and FIG. 11 shows operated states of setting means 26C and 26H.

DETAILED DESCRIPTION OF THE PREFERRED EMBODIMENT

Figure 2:
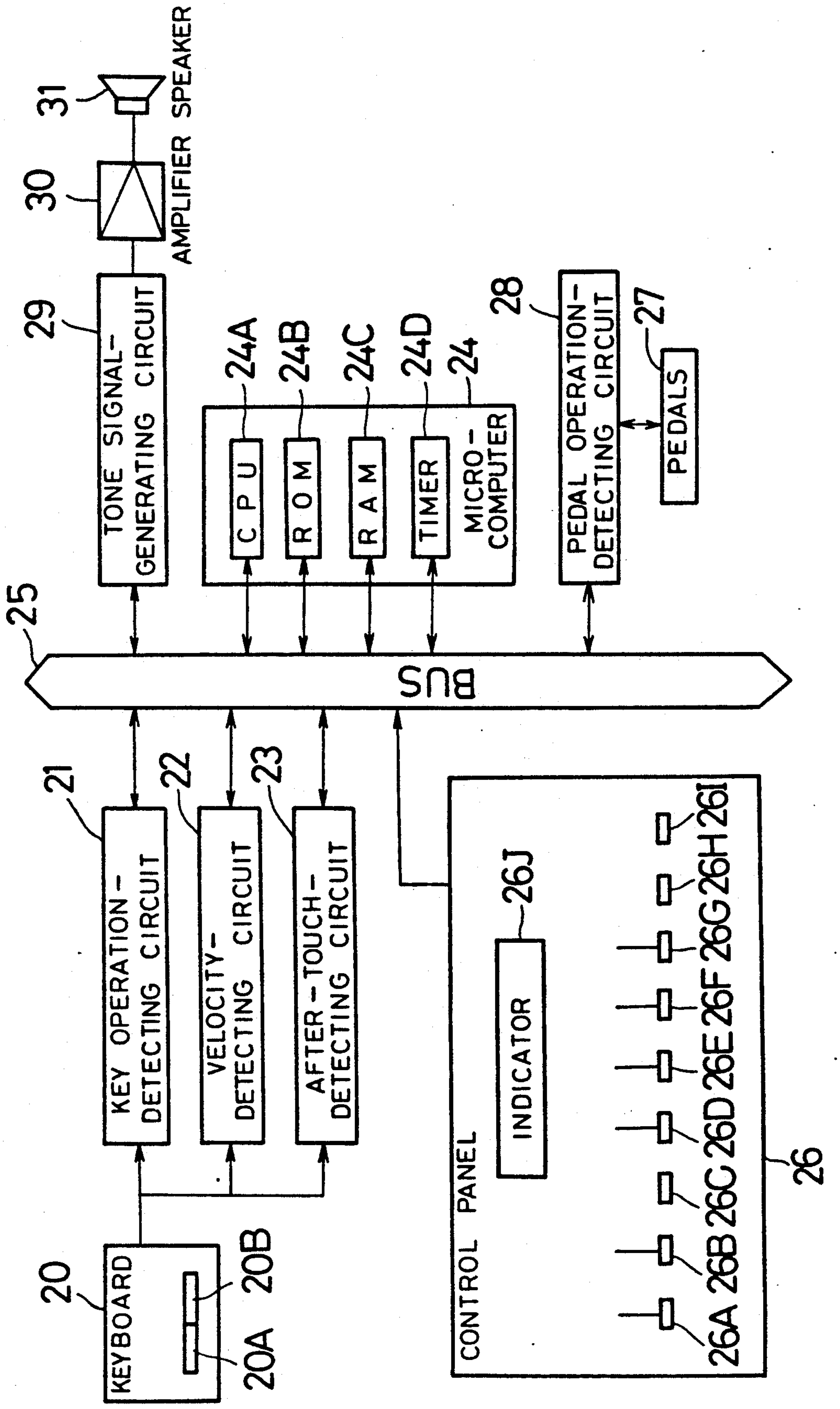

Preferred embodiments of a controllable electronic musical instrument in accordance with the invention will now be described in detail referring to the drawings.

As shown schematically in FIG. 2, the controllable electronic musical instrument in an embodiment of the invention comprises members and structural components as described below.

A keyboard 20 comprises 61 (sixty one) keys corresponding to C2-octave to C7-octave wherein two white keys "C2" and "D2" constitute a second part 20A of the keyboard with the remaining white and black keys thereby constituting a first part 20B of the keyboard.

In a playing mode "1" which is a usual manner of playing music by means of such a keyboard, pitches are assigned to generated musical tones by both of the first and the second parts 20B and 20A. Key-press and key-release speeds as well as those pressures which are imparted to keys when they assign pitches to the generated musical tones are made use of to control said musical tones in the usual mode. On the contrary, another playing mode "2" which is peculiar to the invention is such that the keys in second part 20A produce control signals based on their operated states including key-press, key-release and speeds thereof, in addition to pitch assignment and tone control by the first part 20B as in the playing mode "1".

The first part 20B of the keyboard constitutes tone pitch-assigning means in the invention, and the second part 20A provides such manually operable members that constitute the musical instrument in the invention. Each of the control signals which are produced by the second part is expressed as an asymptotic curve as described later in detail with reference to FIG. 8. Magnitude or intensity of each control signal changes therefore in the course of time with a given sharpness of change until it reaches a given ultimate or target level Each sharpness of change and each target level are set by operation of the keys included in the second part 20A of keyboard. Both of the keys "C2" and "D2" in said part 20A produce the control signals which control actual volumes of generated musical tones. In particular, the signals given by the key "D2" cause the actual tone volumes to be higher than a standard volume whereas those given by the key "C2" make the former lower than the latter.

The electronic musical instrument further comprises a key operation-detecting circuit 21 for sensing operations per se of key-press and key-release, a velocity detecting circuit 22 for sensing speeds of the key-press and key-release and an after-touch-detecting circuit 23 for sensing pressures imparted to the keys on the keyboard 20 when they are depressed. Data as key informations which are produced by these three circuits are then controlled by and fed to a microcomputer 24 through a bus 25.

A control panel 26 also included in the musical instrument comprises setting members 26A to 26I and an indicator 26J which are shown in the drawing, as well as other manual members such as a timbre selection switch and a write-commanding switch which are not shown. Operations of these members also are detected under control of and fed to the microcomputer 24 so that data informations obtained thereby are indicated on the indicator 26J also under control of said microcomputer.

The setting members which relate to the invention are as follows.

Setting member 26A: This is utilized to preset a value relative to a target magnitude of control signal which is produced by key-press (key-ON ) of any key on the second part 20A of keyboard.

Setting member 26B: This is utilized to preset another value relative to a magnitude of control signal which is produced according to a speed of key-press of any key on the second part 20A of keyboard.

Setting member 26C: This is utilized to select either an ON-state wherein the key-press speeds as to said second part 20A are relevant to the magnitudes of control signals, or an OFF-state wherein said speeds are not relevant to said magnitudes.

Setting member 26D: This is utilized to preset still another value relative to the sharpness of change in the course of time of the control signal which is produced when any key on the second part 20A is depressed.

Setting member 26E: This is utilized to preset a further value relative to the sharpness of change in the course of time of the control signal in order to cause the sharpness to depend upon the key-press speeds as to said second part 20A of keyboard.

Setting member 26F: This is utilized to preset a still further value relative to the sharpness of change in the course of time of the control signal which is produced when the depressed key on the second part 20A is released.

Setting member 26G: This is utilized to preset a yet still further value relative to the sharpness of change in the course of time of the control signal in order to cause the sharpness to depend upon the key-release speeds as to said second part 20A of keyboard.

Setting member 26H: This is utilized to select another ON-state wherein the key-releases as to said second part 20A are effective to attenuate the magnitudes of control signals, or alternatively another OFF-state wherein said key-releases are not effective to do so.

Setting member 26I: This is used to make selection between the playing mode "1", the playing mode "2 " and a presetting mode. This presetting mode is such that functions of the second part 20A are preset, in other words, the setting members 26A to 26H are operated to decide how to make the control signals dependent upon operations done on the second part 20A. Switching over from one mode to another take place circulatively in the order mentioned above every time when the setting member 26I is operated by depressing same or operated otherwise. In a state wherein one of the playing modes "1" and "2" is going on, a pedal 27 also can shift the ongoing mode to the other alternative mode.

The pedal 27 is thus useful in making selection between the playing mode "1" and the other playing mode "2" as long as setting member 26I has selected either of them. Each pushing of the pedal causes shift from the former mode to the latter, or vice versa. Operation of the pedal 27 is detected by a pedal operation-detecting circuit 28 to produce a pedal data which the microcomputer 24 controls to take thereinto through the bus 25.

The microcomputer 24 comprises a central processing unit (CPU) 24A adapted to execution of given programs, a read-only memory (ROM) 24B provided for storing the given programs, a random access memory (RAM) 24C necessary to execution of the programs, and a timer circuit 24D for the counting of time lapse during said programs. The random access memory (RAM) 24B has areas defined therein which include a memory zone and a working zone wherein musical tone data and other data are written into the memory zone, while the working zone comprises various registers, data tables and other small areas necessary to the function of the microcomputer.

The RAM 24C is supported with a backup battery so as not to break or lose the data written therein even in the event of a power failure. The programs referred to above are executed based on the tone data, the key informations (such as the states as to key-press and key-release, the speeds thereof and the pressures imparted to the keys) and other data A musical atone signal-generating circuit 29 is controlled by those programs to thereby produce desired musical tone signals which, after amplified in an amplifier 0, drive a speaker 31 to generate audible musical tones.

FIG. 3 shows memory areas assigned to the working zone in RAM 24C, the memory areas being used by the microcomputer 4 to execute such processings as needed in the invention. A register "Key Nos." temporarily stores a key number designating a musical pitch of newly depressed or released key. The key-press or key-release speed thereof is written in another register "Velocity". A still another register "BP" is for memory of the target level of the relevant control signal which has a magnitude changing in the course of time. A further register "K" is provided to write a value corresponding to sharpness of the change in magnitude of said relevant control signal A still further register "Current" temporarily stores a current value of the control signal.

A table "BP1" stores relationships between key-press speeds of the key "D2" on keyboard's second part 20A and target magnitude levels of control signals produced by depression of said key "D2". Another table "BP2" stores relationships between key-press speeds of the key "C2" on keyboard's second part 20A and magnitudes of control signals produced by depression of said key "C2". Memories on the tables "BP1" and "BP2" can be set by means of the setting members 26A, 26B and 26C. Setting method will be described below referring to FIGS. 4(*a*) and 4(*b*).

A further table "KON" stores relationships between key-press speeds of the keys on keyboard's second part 20A and values corresponding to sharpness of changes in the course of time of control signals produced by depression of said keys. Memory on the table "KON" can be set by means of the setting members 26D and 26E. Setting method will be described below also referring to FIG. 4(*a*). A still further table "KOFF" stores relationships between key-release speeds of the keys on keyboard's second part 20A and values corresponding to sharpness of changes in the course of time of control signals produced by release of said keys. Memory on the table "KOFF" also can be set by means of the setting members 26F, 26G and 26H. Setting methods for all of the four tables mentioned above will now be described by means of FIG. 4(*a*), as follows.

Data contained by said four tables are illustrated in FIGS. 4(*a*) and 4(*b*) wherein given along the axis of abscissas are key-press and key-release speeds, inclusively, or key-press speeds only. The stored values are given along the axis of ordinates, solid lines drawn on these drawings respectively show the relationships between the key-press and/or key-release speeds and said stored values. A symbol "Vc" denotes a median value of key-press or key-release speeds (i.e. center value between a maximum and a minimum), another symbol "Lc" denoting a value stored corresponding to the median value "Vc". The aforementioned setting members preset the value "Lc" as well as a gradient of inclined parts of the solid lines.

The setting members 26A to 26H concerning the setting of data to the tabes may be classified into the following three groups, that is:

- Group "II" including the setting members 26A, 26D and 26F which are operated to preset the value "Lc";
- Group "II" including the setting members 26B, 26E and 26G which are operated to preset the gradient of the solid line; and
- Group "III" including the setting members 26C and 26H performing functions other than those listed above.

At first, a case where the setting members 26C and 26H are at their "on" states is described referring to FIG. 4(*a*). The value "Lc" is set by the setting members in the group "I", and the gradient of inclined parts of the solid lines is set by means of the setting members in group "II". For example, the value "Lc" on the table "BP1" is set by the setting member 26A, and the gradient of said inclined parts is set by the setting member 26B. If said values thus set in such a procedure exceed a maximum or minimum value that can be received by relevant memory area or the like, then the maximum or minimum value is written therein in place of the actually set values. The setting members in groups "I" and "II" which are operated in this way make it possible to alter in various manners the relationships between the speeds of key-press or key-release and the magnitudes of produced control signals or the sharpness of their changes in the course of time. The same functions as above are applicable to all the other tables. Each value which is set on the table "BP2" carries minus sign, but its absolute value is equal to that of corresponding value on the table "BP1".

In a case where the setting member 26C is at its "off" state, the (absolute) values on tables "BP1" and on "BP2" assume their maximum values for any corresponding key-press speeds. Further, if the setting member 26H is at its "off" state, then each value on table "KOFF" assumes "0" (zero) for any key-release speed. Also the values on table "BP1" and "BP2" are "0" for key-press speeds lower than a threshold "Vt", as is shown in FIG. 4(*b*). Thus, in a case where both of the setting members 26C and 26H are at their "off" states, the respective values on table "KOFF" assume "0" for respective key-release speeds, with the values on table "BP1" and "BP2" being "0" for key-press speeds lower than the threshold "Vt" and on the other hand being maximum absolute values for key-press speeds equal to or higher than it.

As described above, each table carries thereon various values corresponding to key-press or key-release speeds and capable of being altered due to operation of the setting members.

It will now be apparent that any values within a large range of the control signal values can be read from said tables according to variable operation modes of the setting members and/or according to variable key-press or key-release speeds.

Figure 5:
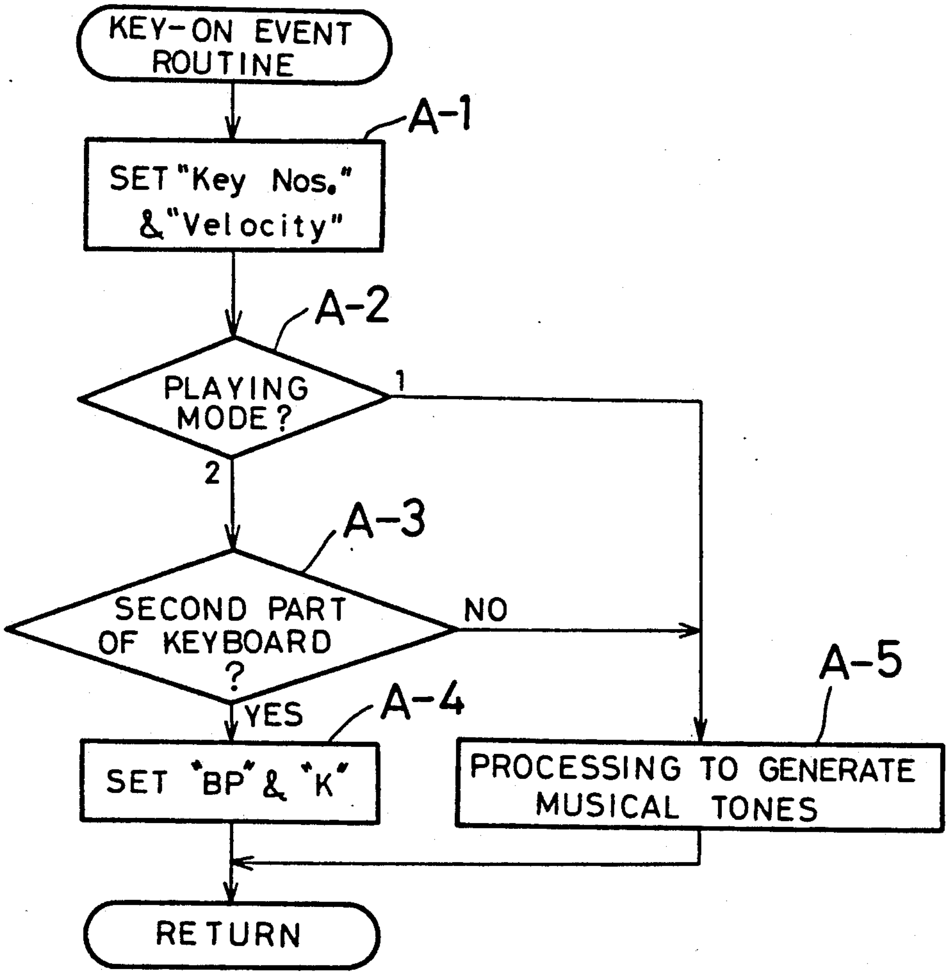
Figure 6:
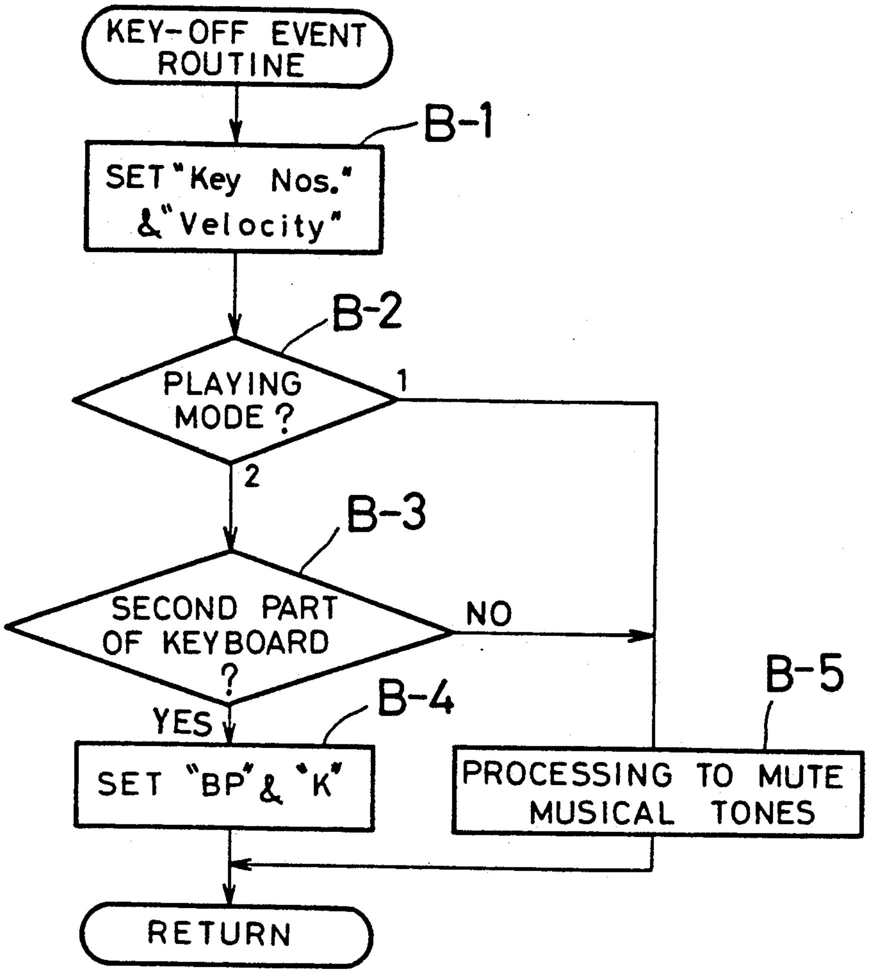
Figure 7:
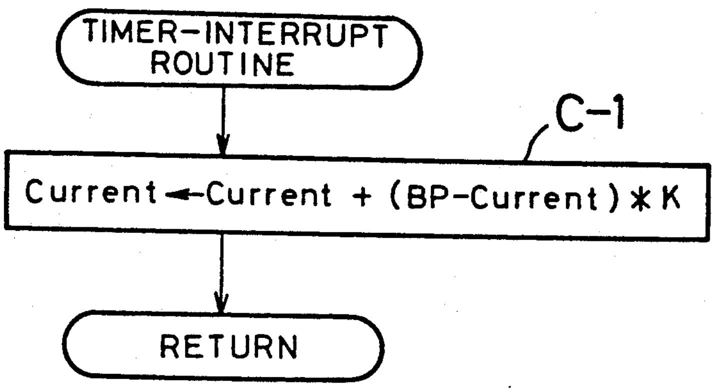

FIGS. 5 to 7 show processings relevant to the invention and executed by the microcomputer 24 when the playing mode "1" or "2" is selected.

A keyon event-routine as given in FIG. 5 shall be executed when any of the keys is newly depressed. At Step A1, a key number of the newly depressed key is written in the register "Key Nos." and its key-press speed is written in the register "Velocity".

At Step A2, a decision is made as to which of the playing modes "1" and "2" has been selected. If the former is the current mode, then the process goes to Step A5, while the process advances to Step A3 in a case where the playing mode "2" is on.

A decision is made at Step A3 on whether the newly depressed key is or is not one included in the second part 20A of keyboard, based on the value currently carried by the register "Key Nos." If yes, then goes to Step A4, but if no, then goes to Step A5.

At Step A4, selection is made either to employ the table "BP1" or "BP2" on the basis of said current value on the register "Key Nos." A target value of control signal is then read from the selected table so as to be written in the register "BP". At the same time, a value corresponding to the sharpness of magnitude change in the control signal magnitude in the course of time is also read from the table "KON" and written in the register "K". Thus, in the playing mode "2", each new depression of any key on the second part 20A determines the control signal parameters such as the target value and the sharpness of magnitude change progressing in the courses of time, based on which key is depressed and at what speed the key is depressed.

At Step A5, the data written in the registers "Key Nos." and "Velocity" as to the newly depressed key are given to the musical tone signal-generating circuit 29 because said key is that which has been depressed to generate musical tone itself, thereby said circuit being energized to generate said musical tone.

On the other hand, a key-off event-routine as given in FIG. 6 shall be executed when the keys which has been depressed is released. At Step B1, a key number of the newly released key is written in the register "Key Nos." and its key-release speed is written in the register "Velocity".

At Step B2, a decision is made as to which of the playing modes "1" and "2" has been selected If the former is the current mode, then the process goes to Step B5, while the process advances to Step B3 in a case where the playing mode "2" is on.

A decision is made at Step B3 on whether the newly depressed key is or is not one included in the second part 20A of keyboard, based on the value currently carried by the register "Key Nos." If yes, then goes to Step B4, but if no, then goes to Step B5.

At Step B4, a value corresponding to the sharpness of magnitude change in the control signal magnitude in the course of time is read from the table "KOFF" and written in the register "K", with "0" being written in the register "BP". Thus, in the playing mode "2", any new release of the keys on the second part 20A determines the control signal parameters such as the target value and the sharpness of magnitude change progressing in the course of time, based on at what speed the key has been depressed.

At Step B5, the data written in the registers "Key Nos." and "Velocity" as to the newly released key are given to the musical tone signal-generating circuit 29 because said key is that which is released after depressed previously to generate musical tone itself, thus said circuit being disenergized to mute said musical tone.

Figures 8, 11:
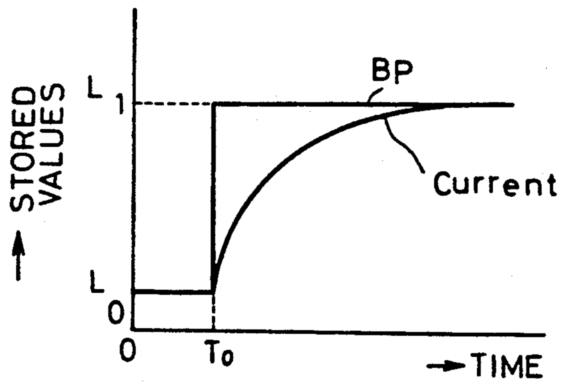

The respective control signals are produced as shown in FIG. 7 in accordance with respective timer interrupts which are given at regular intervals by the timer circuit 24D counting time lapse during the program. At Step C1, a current value of control signal written in the register "Current" is subtracted from the target value of control signal which is written in the register "BP", thereby giving a difference which is then multiplied by the value stored in the register "K" and corresponding to the sharpness of magnitude change of the control signal in the course of time. A product resulting from this multiplications is added to the current value of control signal to thereby produce a sum which is a new current value of control signal to be written in the register "Current" and to be given to the musical tone signal-generating circuit 29. (The value written in the register "K" is not less than "0" and not higher than "1") FIG. 8 shows a result which this processing gives. Time lapse is given therein along the axis of abscissas, and values written in the registers "BP" and "Current" so as to be temporarily stored therein in the course of time are given along the axis of ordinates. Assuming that both of the values stored in the registers "BP" and "Current" are "L0" until a point of time "T0" has come, at which point the value in the register "BP" is altered to "L1", then the value held by the register "Current" will increase asymptotically towards the value "L1" with a sharpness of magnitude change which in turn is given by the register "K". Therefore, control signals of various types are produced by writing different values into the registers "BP" and "K".

Figure 9:
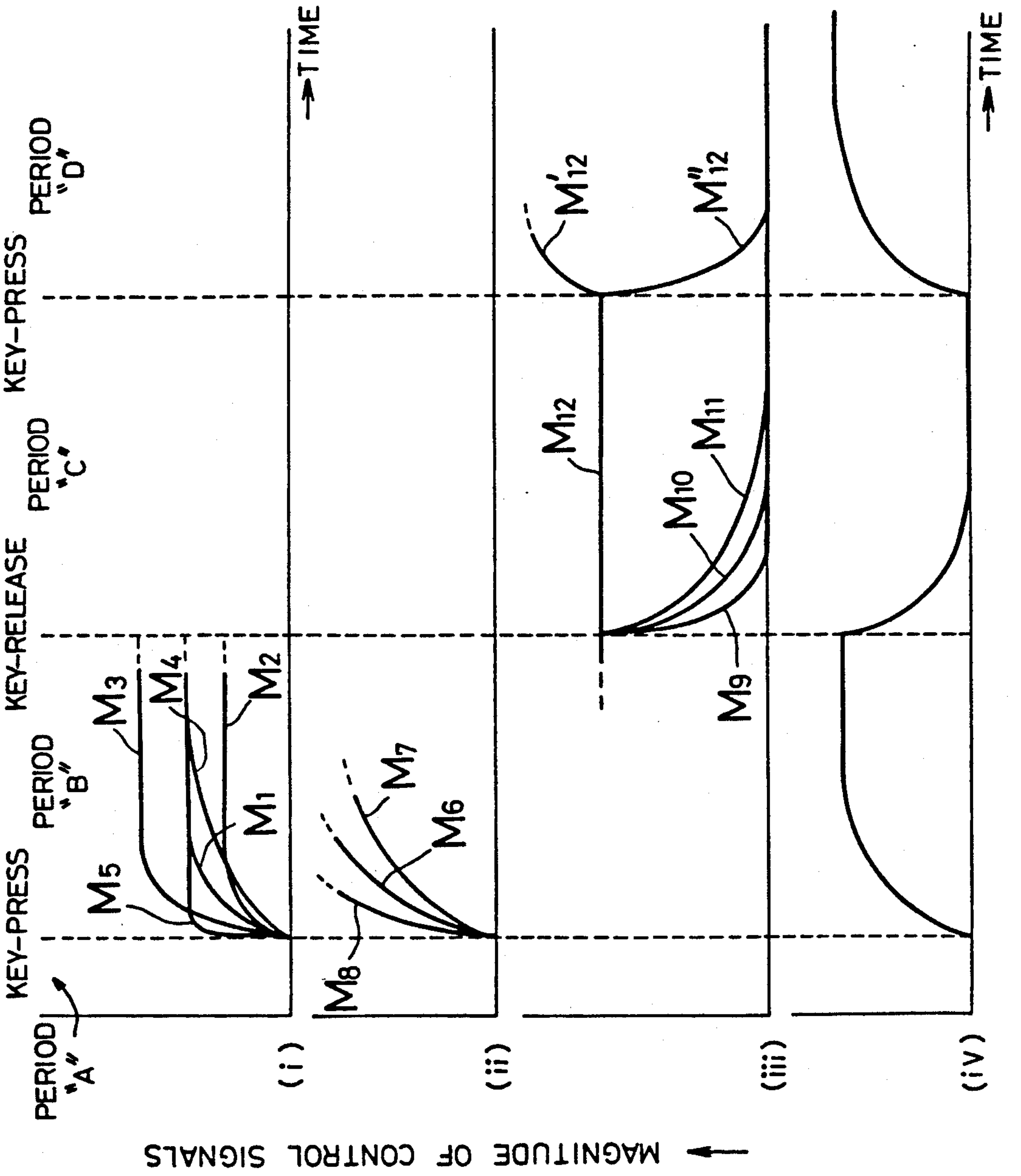

FIGS. 9(*i*) to 9(*iv*) illustrate relationships of some patterns which may be produced between magnitudes of control signals and the key-press and key-release of key "D2" on the second part 20A in the electronic musical instrument in the invention, with respect to time lapse. Here is supposed that no key is depressed within periods of time "A" and "C", but the key "D2" is depressed in periods "B" and "D". Time lapse and control signal magnitude are given along the axes of abscissas and of ordinates, respectively. Although FIGS. 9(*i*) to 9(*iv*) are for those control signals each carrying a plus sign which signals are produced by depression of the key "D2", similar curves of control signals each carrying a minus sign will be obtained by depression of the key "C2".

FIG. 9(*i*) corresponds to such a condition that the setting member 26C is turned on so that the key-press speed of any key on the second part 20A provides the target values for control signals which are to be produced by depression of keys on the second part of keyboard A line M1 represents a case where the setting members 26A and 26E are set at their center positions each giving a median value (i.e., a center value between a maximum and a minimum) and the keys of said second part are depressed at median key-press speeds whereby the control signal magnitudes rise at a given sharpness of change until they reach a given level of magnitude. The given level of magnitude can be varied as shown by lines M2 or M3 if the setting member 26A is manipulated with the keys depressed at the same speed or velocity as that in the case of line Ml. The given sharpness observed when said control signal magnitudes rise may be altered to such a sharpness as shown by lines M4 and M5 if the setting member 26D is manipulated with the key-press speed or velocity remaining unchanged.

On the other hand, said key-press speed also is changeable to vary the given levels of control signal magnitudes and the rising sharpness thereof as shown by the lines M1 to M5 even if the setting members 26A and 26D were kept to be at their median positions. A relationship between said key-press speed and said magnitude levels can be varied by means of the setting member 26B, while a relationship between said key-press speed and said rising sharpness can be varied by means of the setting member 26E.

Control signals of another type shown in FIG. 9(*ii*) are obtainable by setting the setting member 26C at its "off"-state wherein the key-press speed for keyboard's second part 20A does not affect the magnitude of control signals. Lines M6 to M8 in such a case show the control signals which start to rise once a key is depressed at given speeds continue to increase their magnitudes towards a maximum level until the depressed key are released. Manipulation of the setting members 26A and 26B gives in this case no influence upon the control signals. If the magnitudes have reached the maximum before the key is released, then they are maintained thereafter at the maximum level. The sharpness of rising magnitudes is changeable by means of the setting members 26D, 26E and key-press speed, as is in the case of FIG. 9(*i*).

FIG. 9(*iii*) shows control signals produced when a key which has been depressed is released. Lines M9 to M11 therein indicate attenuation of the control signals, which attenuation occurs due to key-release on the second part 20A with the setting member 26H being set at its "on"-state. Sharpness or rapidity of attenuation can be changed among the lines M9, M10 and M11 in a manner similar to that in the case of FIG. 9(*i*) by manipulation of the setting members 26F or 26G and also by alteration of the key-release speed or velocity.

A line M12 in FIG. 9(*iii*) represents a case where the setting member 26H is at its "off"-state, that is, such a state that release of the keys on keyboard's second part 20A does not cause attenuation of the control signals. In this case, magnitude of control signal produced by the key remains unchanged at a level which has been effective at an instant when said key is released.

Lines M'12 and M"12 adjoining the line M12 illustrate changes in the control signal magnitude, which changes occur caused by the next key-press. The line M'12 corresponds to a key-press speed or velocity of a level equal to or higher than the threshold value "Vt" wherein the control signal magnitude gradually changes towards a value given by said next key-press. The other line M"12 corresponds to the key-press speed of another level lower than said threshold value "Vt" wherein said control signal magnitude gradually attenuates towards "0". This manner of control is provided owing to the fact that the relevant data are stored in the tables "BP1" and "BP2" as is shown in FIG. 4(*b*). Thus, attenuation of control signal magnitude can take place even in a case where there is employed a mode such that the control signal magnitude standing just before the key-release is maintained.

Consecutive changes in control signal magnitude in the course of time are given in FIG. 9(*iv*) for a case where both of the setting members 26C and 26H are set at their "on"-states. As seen from FIG. 9(*iv*), any key-press increases the control signal magnitude, but key-release attenuates same. Consequently, musical tone volume may be controlled based on those control signals to produce a fade-in/fade-out effect by means of key-press/-release operations done on the second part 20A of the keyboard.

Figure 10:
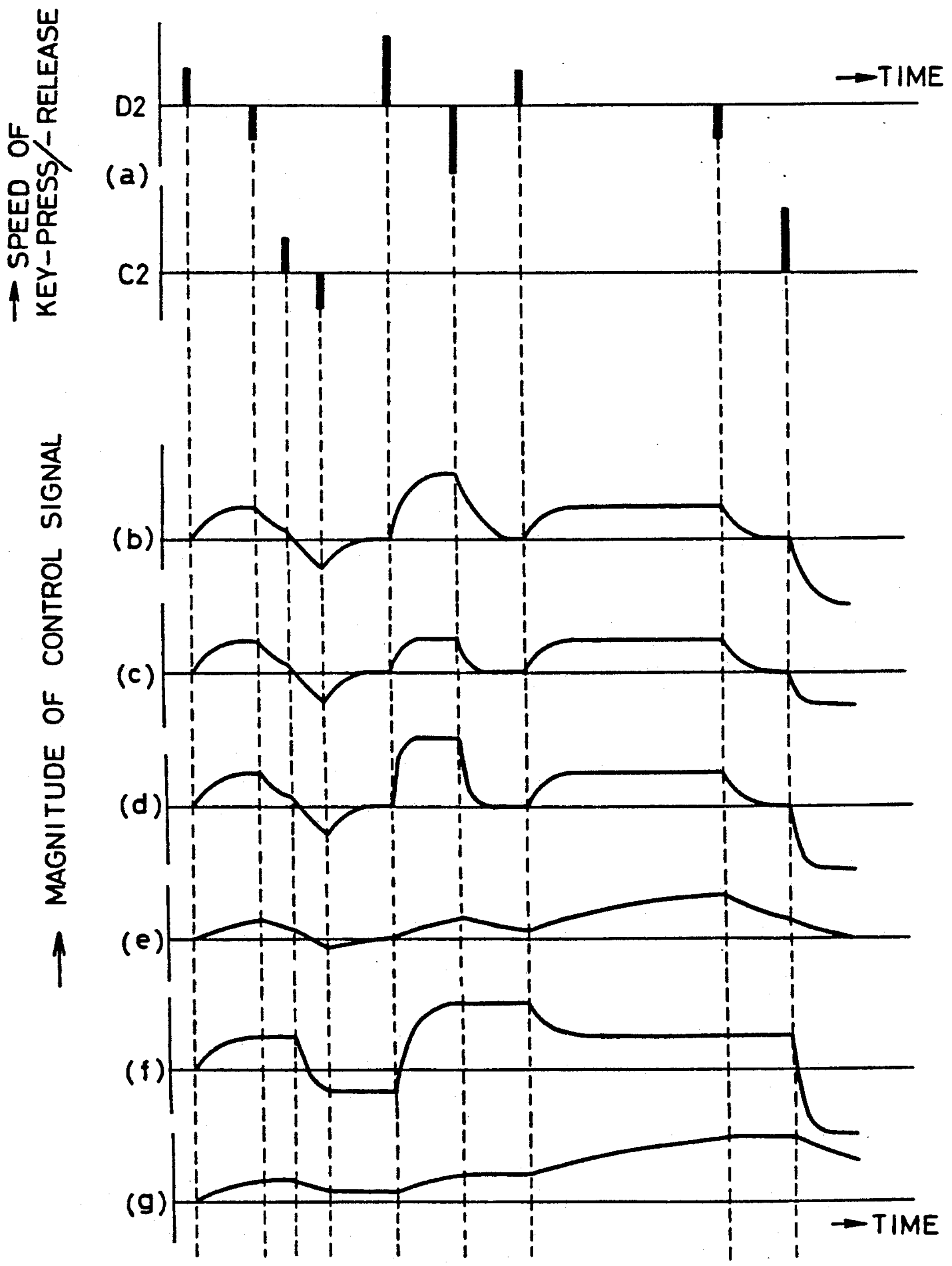

Detailed examples of playing practices are given in FIGS. 10 (*a*) to 10(*g*) among which FIG. 10(*a*) illustrates key-press and key-release speeds or velocities of the keys "D2" and "C2" in the electronic musical instrument in the invention. The axis of abscissas indicates time lapse, and the axis of ordinates indicates said speeds with upright bars corresponding to key-press and with hanging-down bars corresponding to key-release. Control signals produced by such key-press and key-release as shown in FIG. 10(*a*) are given in FIGS. 10(*b*) to 10(*g*) dependent upon combinations of operated states of the setting members 26C and 26H. Here, the axes of ordinates indicate control signal magnitudes as deviations or differences from a standard level of generated musical tones. FIG. 11 shows such combinations of said operated states of the members 26C and 26H in operation modes represented by FIGS. 10(*b*) to 10(*g*), respectively.

FIG. 10(*b*) illustrates a case in which both of the setting members 26C and 26H are set at their "on"-states and also in which key-press speeds determine the magnitudes of control signals. In detail, the key-press speed or velocity of the keys "D2" and "C2" causes alteration of target value of the control signals, while key-release causes attenuation thereof.

FIG. 10(*c*) is for another case in which also the setting members 26C and 26H are at their "on"-states but in which key-press and key-release speeds control and vary the sharpness or rapidity of change in the control signals in the course of time in such a manner that key-release causes attenuation of absolute values of the control signals.

FIG. 10(*d*) is for still another case in which, with said setting members at "on"-states, both of the magnitudes of and the sharpness of change in said control signals in the course of time are dependent upon the key-press and key-release speeds, wherein key-release causes attenuation of absolute values of the control signals.

FIG. 10(*e*) describes a further case in which the setting member 26C is at its "off"-state with the member 26H kept at its "on"-state and the sharpness of change in control signal magnitude in the course of time is previously set at a lower level. The target value of control signal remains constant (maximum) independent upon key-press speed. However, the control signal magnitude continues to change as long as the key is kept in depressed state whereby said magnitude can be controlled by changing duration of the depressed state. Key-release also causes attenuation of absolute values of control signals.

FIG. 10(*f*) describes a still further case in which the setting member 26C is at its "on"-state with the member 26H held at its "on"-state, and the control signal magnitude is kept at its current value even after key-release. An operator of the instrument can concentrate all his attention upon key-press operation since no change in control signal is caused by key-release.

FIG. 10(*g*) illustrates a yet further case in which both of the setting members 26C and 26H are set at their "off"-states and the sharpness of change in control signal magnitude in the course of time is previously set at the lower level. The target value of control signal remains constant independent upon key-press speed, and the control signal magnitude is kept at its then current value even after key-release. The control signal magnitude in this case also continues to change as long as the key is kept in depressed state whereby said magnitude can be controlled by changing duration of the depressed state. The operator of the instrument can concentrate also in this case all his attention upon key-press operation since no change in control signal is caused by key-release.

As described hereinabove, "key-touches" of depressed keys in the keyboard's second part 20A are detected to produce control signals of various kinds which are different from each other in respect of their changes in magnitude in the course of time, thereby enabling volume control of musical tones.

The relationship between the control signals and the key-press and key-release speeds may be calculated each time when necessary although they are previously stored in the tables in the embodiment.

A variable threshold value "Vt" may be employed, instead of fixed one in the embodiment, to write "0" as values on table "BP1" and "BP2" for key-press speeds lower than said threshold in the case of the setting member 26H operated to its "off" state.

Although volume control of musical tones is performed by such a described system in the embodiment, the system may be modified to perform control of any other parameters such as pitch or timbre of each musical tone, degree of "chorus" effect or other musical effects, magnitude or velocity of modulation signals, and an adding weight of a particular waveform in addition of some waveforms, as long as they are treated with by the musical tone signal-generating circuit 29. Plural parameters may be controlled by means of a single key, or different parameters may be controlled by different keys, respectively. In the latter case, different relationships between key-press/-release speeds and control signals may be assigned respectively to the different parameters.

It may also be possible that a suitable memory means stores for each of the setting members 26A to 26H disposed on the control panel 26 plural modes of relationship between operation of the keyboard's second part and control signals wherein one of the modes may be read from said memory for each setting member before starting to play music, although each setting member merely controls only one of such relationships in the embodiment. Further, each of such relationships between said operation and said control signals may be stored together with any other parameters such as timbre, musical effect or the like whereby the reading of latter parameter can simultaneously set former relation for each setting member for the keyboard's second part.

Although only the key-press/-release (on/off) and the speeds or rapidity thereof are utilized to produce the control signals, a pressure imparted to each depressed key may produce an additional signal which may be added to the control signals for more sophisticated or complicate control of musical tones. It is a matter of course that such a case where no pressure is imparted to the keys will correspond to that case which is described in the embodiment.

Any keys may be substituted for the keys "C2" and "D2" which are used consistently in the embodiment as the manually operable members producing detectable operation touches, if they are convenient for player's operation. There may be employed a further modified system in which some or all of the substituted keys can be chosen by the player at his discretion when he plays music. Further, any manually operable members different from the keys may be incorporated. The manually operable members producing detectable touches may be of any type other than "keys".

Although the keyboard provides the tone pitch-assigning means in the embodiment, any other suitable members may be used as such means Although all of the tone pitch-assigning means, the manually operable members, the control message-producing means and the musical tone-generating means in the embodiment are incorporated in the single electronic musical instrument, they may be separately built in some instruments and interconnected one another by an information transmitting means such as an MIDI (Musical Instrument Digital Interface ).

Although the musical tone-controlling messages in the embodiment are of magnitudes which exponentially change in the course of time, the magnitudes may change linearly giving straight lines with respective gradients which may be utilized as the sharpness of change.

Furthermore, the manually operable members may merely vary either the sharpness of change in or the magnitude of the musical tone-controlling messages if it is sufficient for the purpose mentioned above, although both of those two parameters are employed in the embodiment.

What is claimed is:

1. A controllable electronic musical instrument, said instrument comprising:

(a) tone pitch-assigning means for assigning pitches to musical tones which are to be generated, (b) members manually operable by touch for producing detectable signals indicative of touching of the members, (c) control message-producing means, responsive to signals from the manually operable members, for producing musical tone-controlling messages, each of the messages having a magnitude which automatically changes in time, and (d) musical tone-generating means for automatically generating musical tones based on musical tone-controlling messages produced by the control message-producing means and on a pitch assigned by the tone pitch-assigning means.

2. A controllable electronic musical instrument as set forth in claim 1 wherein the manually operable members comprises a first operable member and a second operable member, the first operable member causing generation of musical tone-controlling messages that have actual magnitudes higher than a predetermined magnitude and the second operable member causing generation of musical tone-generating messages that have actual magnitudes lower than the predetermined magnitude.

3. A controllable electronic musical instrument as set forth in claim 1 wherein signals from the manually operable members represent speeds at which the manually operable members are operated from their OFF-states into their ON-states or speeds at which the members are operated from their ON-states into their OFF-states.

4. A controllable electronic musical instrument as set forth in claim 2 wherein the control message-producing means produces musical tone-controlling messages each time the manually operable members are operated to place them in their ON-states or to place them in their OFF-states.

5. A controlled electronic musical instrument as set forth in claim 1 wherein the control message-producing means produces musical tone-controlling messages, each of the messages having a magnitude which increases or decreases in time up to or down to different values, the sharpness of change of the messages corresponding to touching of the manually operable members.

6. A controllable electronic musical instrument as set forth in claim 1 wherein the control message-producing means produces musical tone-controlling messages with magnitudes which change in time with a sharpness of change that corresponds to touching of the manually operable members.

7. A controllable electronic musical instrument as set forth in claim 1 wherein the control message-producing means produces musical tone-controlling messages with magnitudes which increase or decrease in time to values that correspond with touching of the manually operable members.

8. A controllable electronic musical instrument as set forth in claim 1 wherein produced musical tone-controlling messages relate to different musical parameters, the parameters including tone pitch, timbre, tone volume, modulation depth, modulation speed and combinations thereof.

9. A controllable electronic musical instrument as set forth in claim 1 wherein produced musical tone-controlling messages have magnitudes that increase in value based upon touching of the manually operable members during operation of the manually operable members and magnitudes that decrease to predetermined values after operation of the members is stopped.

10. A controllable electronic musical instrument as set forth in claim 1 wherein produced musical tone-controlling messages have magnitudes that change during operation of the manually operable members and that do not change during non-operation thereof, the magnitudes during non-operation being at levels which are current at an instant when operation of the manually operable members is stopped.

11. A controllable electronic musical instrument as set forth in claim 10 wherein produced musical tone-controlling messages have magnitudes that increase to predetermined values when the manually operable members are touched at a strength that is weaker than a predetermined touch strength.

12. A controllable electronic musical instrument as set forth in claim 1 wherein produced musical tone-controlling messages have magnitudes that decrease in value based upon touching of the manually operable members during operation of the manually operable members and magnitudes that increase to predetermined values after operation of the members is stopped.

13. A controllable electronic musical instruemnt as set forth in claim 10 wherein produced musical tone-controlling messages have magnitudes that decrease to predetermined values when the manually operable members are touched at a strength that is weaker than a predetermined touch strength.

* * * * *